(12) United States Patent
Park

(10) Patent No.: US 11,295,816 B2
(45) Date of Patent: Apr. 5, 2022

(54) SEMICONDUCTOR MEMORY DEVICE AND METHOD OF OPERATING THE SEMICONDUCTOR MEMORY DEVICE

(71) Applicant: SK hynix Inc., Icheon-si (KR)

(72) Inventor: Hyun Kyu Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/028,628

(22) Filed: Sep. 22, 2020

(65) Prior Publication Data

US 2021/0319830 A1 Oct. 14, 2021

(30) Foreign Application Priority Data

Apr. 10, 2020 (KR) ........................ 10-2020-0044185

(51) Int. Cl.
| | | |
|---|---|---|
| *G11C 16/10* | (2006.01) | |
| *G11C 16/08* | (2006.01) | |
| *G11C 16/34* | (2006.01) | |
| *G11C 16/30* | (2006.01) | |
| *G11C 16/32* | (2006.01) | |
| *G11C 16/26* | (2006.01) | |

(52) U.S. Cl.
CPC .............. *G11C 16/08* (2013.01); *G11C 16/10* (2013.01); *G11C 16/26* (2013.01); *G11C 16/30* (2013.01); *G11C 16/32* (2013.01); *G11C 16/3404* (2013.01)

(58) Field of Classification Search
CPC ......... G11C 16/10; G11C 16/26; G11C 16/30; G11C 16/32
USPC ....................................................... 365/185.23
See application file for complete search history.

(56) References Cited

U.S. PATENT DOCUMENTS

| 9,349,478 | B2 * | 5/2016 | Yuan | ....................... | G11C 16/10 |
| 2016/0093390 | A1 * | 3/2016 | Yuan | ....................... | G11C 16/10 |
| | | | | | 714/764 |
| 2020/0168280 | A1 * | 5/2020 | Seo | .................... | G11C 16/3427 |
| 2020/0388312 | A1 * | 12/2020 | Park | ....................... | G11C 7/109 |

FOREIGN PATENT DOCUMENTS

| KR | 1020150106658 A | 9/2015 |
| KR | 1020160004068 A | 1/2016 |

\* cited by examiner

*Primary Examiner* — Xiaochun L Chen
(74) *Attorney, Agent, or Firm* — William Park & Associates Ltd.

(57) ABSTRACT

Provided herein is a semiconductor memory device and a method of operating the semiconductor memory device. The semiconductor memory device includes: a memory cell array including a plurality of word lines; a peripheral circuit coupled to the memory cell array through the plurality of word lines and configured to apply a program voltage to a selected word line of the plurality of word lines during a program operation and apply a pass voltage to unselected word lines of the plurality of word lines; and control logic configured to control the peripheral circuit to apply a first pass voltage to word lines adjacent to the selected word line among the unselected word lines during a first program operation of the program operation and apply a second pass voltage to the word lines adjacent to the selected word line during a second program operation of the program operation.

15 Claims, 19 Drawing Sheets

BLK1

SEMICONDUCTOR MEMORY DEVICE AND METHOD OF OPERATING THE SEMICONDUCTOR MEMORY DEVICE

CROSS-REFERENCE TO RELATED APPLICATION

The present application claims priority under 35 U.S.C. § 119(a) to Korean patent application number 10-2020-0044185, filed on Apr. 10, 2020, in the Korean Intellectual Property Office, the entire disclosure of which is incorporated herein by reference.

BACKGROUND

1. Technical Field

Various embodiments of the present disclosure relate to an electronic device, and more particularly, to a semiconductor memory device and a method of operating the semiconductor memory device.

2. Related Art

Recently, the paradigm for the computer environment has been converted into ubiquitous computing so that computer systems can be used anytime and anywhere. Thereby, the use of portable electronic devices such as mobile phones, digital cameras, and notebook computers has rapidly increased. In general, such portable electronic devices use a memory system which employs a semiconductor memory device, in other words, use a data storage device. The data storage device is used as a main memory device or an auxiliary memory device of the portable electronic devices.

A data storage device using a semiconductor memory device provides advantages in that, since there is no mechanical driving component, stability and durability are excellent, an information access speed is increased, and power consumption is reduced. Examples of a data storage device proposed as the memory system having such advantages may include a universal serial bus (USB) memory device, a memory card having various interfaces, and a solid state drive (SSD).

Semiconductor memory devices are classified into a volatile memory device and a nonvolatile memory device.

Although read and write speeds are comparatively low, the nonvolatile memory device can retain data stored therein even when power supply is interrupted. Therefore, the nonvolatile memory device is used when there is the need for storing data which must be maintained regardless of supply of power. Representative examples of the nonvolatile memory device include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into a NOR type memory and a NAND type memory.

SUMMARY

An embodiment of the present disclosure may provide for a semiconductor memory device including: a memory cell array including a plurality of word lines; a peripheral circuit coupled to the memory cell array through the plurality of word lines and configured to apply a program voltage to a selected word line of the plurality of word lines during a program operation and apply a pass voltage to unselected word lines of the plurality of word lines; and control logic configured to control the peripheral circuit to apply a first pass voltage to word lines adjacent to the selected word line among the unselected word lines during a first program operation of the program operation and apply a second pass voltage to the word lines adjacent to the selected word line during a second program operation of the program operation.

An embodiment of the present disclosure may provide for a semiconductor memory device including: a memory cell array including a plurality of word lines; a peripheral circuit coupled to the memory cell array through the plurality of word lines and configured to apply a program voltage to a selected word line of the plurality of word lines during a program operation and apply a pass voltage to unselected word lines of the plurality of word lines; and control logic configured to control the peripheral circuit to perform a program voltage application operation of applying the program voltage and the pass voltage to the plurality of word lines for a first time during a first program operation of the program operation and perform the program voltage application operation for a second time during a second program operation of the program operation.

An embodiment of the present disclosure may provide for a semiconductor memory device including: a memory cell array including a plurality of word lines; a peripheral circuit coupled to the memory cell array through the plurality of word lines and configured to apply a program voltage to a selected word line of the plurality of word lines during a program operation and apply a pass voltage to unselected word lines of the plurality of word lines; and control logic configured to control the peripheral circuit to apply a first pass voltage to word lines adjacent to the selected word line among the unselected word lines in a preset number of program loops during the program operation and apply a second pass voltage to the word lines adjacent to the selected word line in remaining program loops other than the preset number of program loops.

An embodiment of the present disclosure may provide for a method of operating a semiconductor memory device, including: performing a first program operation by applying a program voltage to a selected word line and applying a first pass voltage to word lines adjacent to the selected word line; and performing a second program operation by applying the program voltage to the selected word line and applying a second pass voltage less than the first pass voltage to the word lines adjacent to the selected word line.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Various embodiments of the present disclosure will now be described hereinafter with reference to the accompanying drawings.

Various embodiments of the present disclosure are directed to a semiconductor memory device capable of improving the data reliability, and a method of operating the semiconductor memory device.

Figure 1:
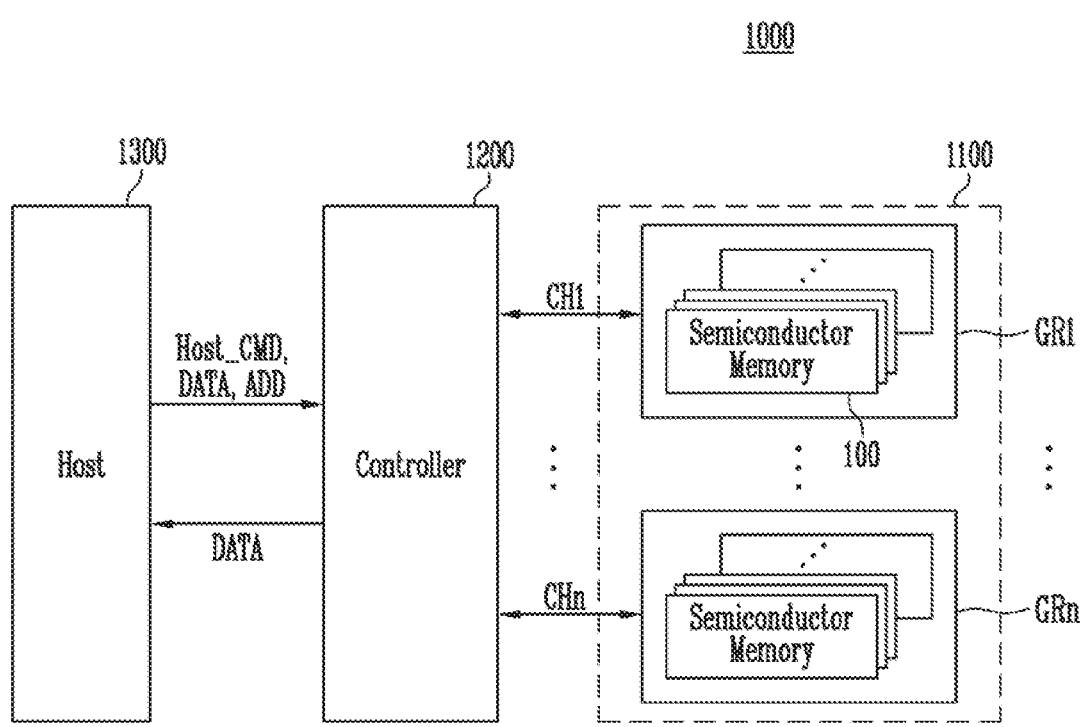
FIG. 1. is a block diagram for describing a memory system including a memory device in accordance with an embodiment of the present disclosure.

FIG. 1 is a block diagram for describing a memory system 1000 including a memory device 1100 in accordance with an embodiment of the present disclosure.

Referring to FIG. 1, the memory system 1000 may include a memory device 1100, a controller 1200, and a host 1300. The memory device 1100 may include a plurality of semiconductor memories 100. The plurality of semiconductor memories 100 may be divided into a plurality of groups GR1 to GRn. Although in an embodiment the host 1300 has been illustrated and described as being included in the memory system 1000, the memory system 1000 may include only the controller 1200 and the memory device 1100, and the host 1300 may be disposed outside the memory system 1000.

In FIG. 1, it is illustrated that the plurality of groups GR1 to GRn of the memory device 1100 communicate with the controller 1200 through first to n-th channels CH1 to CHn, respectively. Each semiconductor memory 100 will be described below with reference to FIG. 2.

Each of the plurality of groups GR1 to GRn may communicate with the controller 1200 through a common channel. The controller 1200 may control the plurality of semiconductor memories 100 of the memory device 1100 through the plurality of channels CH1 to CHn.

In an embodiment of the present disclosure, when a command corresponding to a program operation is received, the plurality of semiconductor memories 100 included in the memory device 1100 may perform a program operation including a first program operation and a second program operation on memory cells coupled to selected word lines. Here, the plurality of semiconductor memories 100 may set a pass voltage to be applied to word lines adjacent to a selected word line such that a pass voltage to be applied during the first program operation differs from a pass voltage to be applied during the second program operation. For example, the plurality of semiconductor memories 100 may apply a relatively high pass voltage to the word lines adjacent to the selected word line during the first program operation, and apply a relatively low pass voltage to the word lines adjacent to the selected word line during the second program operation. Furthermore, the plurality of semiconductor memories 100 may set a program voltage application operation time during the first program operation and a program voltage application operation time during the second program operation to different values. For example, the plurality of semiconductor memories 100 may perform the program voltage application operation for a relatively long time during the first program operation, and perform the program voltage application operation for a relatively short time during the second program operation.

In an embodiment, the semiconductor memories 100 may perform a program operation on memory cells coupled to a selected word lines in an incremental step pulse program scheme, and may apply a relatively high pass voltage to word lines adjacent to the selected word line within a preset number of program loops, and apply a relatively low pass voltage to the word lines adjacent to the selected word line in a program loop after the preset number of program loops. Furthermore, the program voltage application operation may be performed for a relatively long time within the preset number of program loops. The program voltage application operation may be performed for a relatively short time in a program loop after the preset number of program loops.

The controller 1200 is coupled between the host 1300 and the memory device 1100. The controller 1200 may access the memory device 1100 in response to a request from the host 1300. For example, the controller 1200 may control a read operation, a program operation, an erase operation, or a background operation of the memory device 1100 in response to a host command Host_CMD received from the host 1300. The host 1300 may transmit, along with the host command Host_CMD, an address ADD and data DATA to be programmed during a program operation, and may transmit an address ADD along with the host command Host_CMD during a read operation. During the program operation, the controller 1200 may transmit, to the memory device 1100, a command corresponding to the program operation and data DATA to be programmed. During the read operation, the controller 1200 may transmit a command corresponding to the read operation to the memory device 1100, receive read data DATA from the memory device 1100, and transmit the received data DATA to the host 1300. The controller 1200 may provide an interface between the memory device 1100 and the host 1300. The controller 1200 may run firmware for controlling the memory device 1100.

The host 1300 may include a portable electronic device such as a computer, a personal digital assistant (PDA), a portable multimedia player (PMP), an MP3 player, a camera, a camcorder, or a mobile phone. The host 1300 may use a host command Host_CMD to make a request for a program operation, a read operation, an erase operation, etc. of the memory system 1000. To perform a program operation of the memory device 1100, the host 1300 may transmit, to the controller 1200, a host command Host_CMD, data DATA, and an address ADD corresponding to the program operation. To perform a read operation, the host 1400 may transmit, to the controller 1200, a host command Host_CMD, and an address ADD corresponding to a read command. Here, the address ADD may be a logical address of data.

The controller 1200 and the memory device 1100 may be integrated into a single semiconductor memory device. In an embodiment, the controller 1200 and the memory device 1100 may be integrated into a single semiconductor memory device to form a memory card. For example, the controller 1200 and the memory device 1100 may be integrated into a single semiconductor memory device and form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), or a universal flash storage (UFS).

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the memory device 1100 or the memory system 1000 may be embedded in various types of packages. For example, the memory device 1100 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIL), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP).

Figure 2:
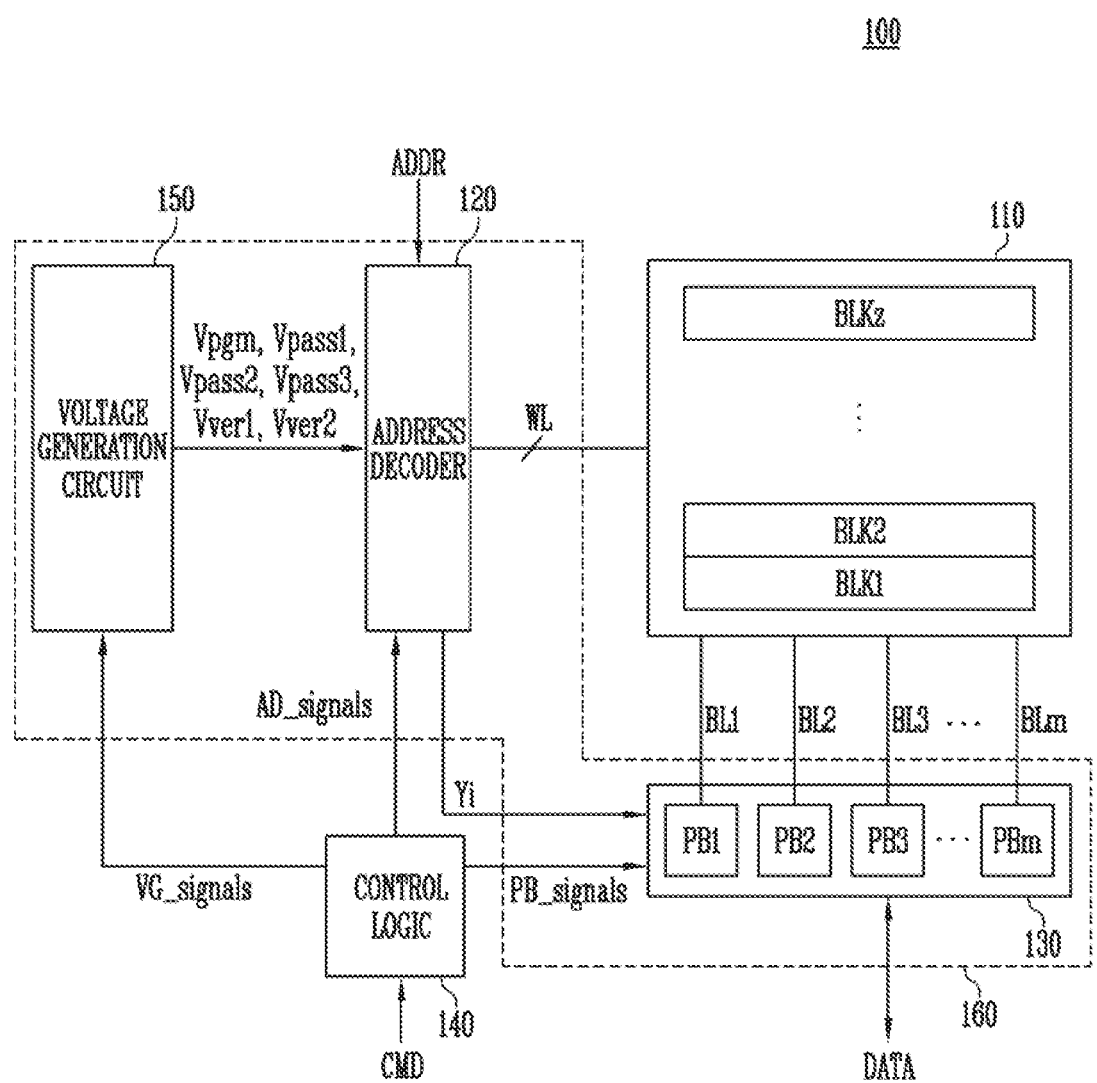
FIG. 2 is a diagram illustrating a semiconductor memory device included in the memory device of FIG. 1.

FIG. 2 is a diagram illustrating a semiconductor memory device included in the memory device of FIG. 1.

Referring to FIG. 2, the semiconductor memory 100 may include a memory cell array 110, an address decoder 120, a read/write circuit 130, control logic 140, and a voltage generation circuit 150. The address decoder 120, the read/write circuit 130, and the voltage generation circuit 150 may be defined as a peripheral circuit 160 configured to perform a program operation on the memory cell array 110, The control logic 140 may be implemented as hardware, software, or a combination of hardware and software. For example, the control logic 140 may be a control logic circuit operating in accordance with an algorithm and/or a processor executing control logic code.

The memory cell array 110 may include a plurality of memory blocks BLK1 to BLKz. The plurality of memory blocks BLK1 to BLKz are coupled to the address decoder 120 through word lines WL. The memory blocks BLK1 to BLKz may be coupled to the read/write circuit 130 through bit lines BL1 to BLm. Each of the memory blocks BLK1 to BLKz may include a plurality of memory cells. In an embodiment, the plurality of memory cells may be nonvolatile memory cells.

Each of the memory blocks BLK1 to BLKz of the memory cell array 110 includes a plurality of memory strings. Each of the memory strings includes a drain select transistor, a plurality of memory cells, and a source select transistor which are coupled in series between a bit line and a source line. Furthermore, each of the plurality of memory strings may include pass transistors respectively provided between the source select transistor and the memory cells and between the drain select transistor and the memory cells, and may further include a pipe gate transistor between the memory cells. The memory cell array 110 will be described later herein.

The address decoder 120 may be coupled to the memory cell array 110 through the word lines WL, The address decoder 120 may be operated in response to address decoder control signals AD_signals generated from the control logic 140. The address decoder 120 may receive addresses ADDR through an input/output buffer (not shown) provided in the semiconductor memory 100.

The address decoder 120 decodes a row address of the received address ADDR and applies, during a program operation, a plurality of operation voltages including a program voltage Vpgm, pass voltages Vpass1 to Vpass3, verify voltages Vver1 and Vver2 that are generated from the voltage generation circuit 150, to a plurality of memory cells of the memory cell array 110 in accordance with a decoded row address obtained by decoding a row address of the received addresses ADDR.

The address decoder 120 may decode a column address among the received addresses ADDR. The address decoder 120 may transmit the decoded column address Yi to the read/write circuit 130.

Addresses ADDR received during a program operation include a block address, a row address, and a column address. The address decoder 120 may select one memory block and one word line based on the block address and the row address. The column address may be decoded by the address decoder 120 and provided to the read/write circuit 130.

The address decoder 120 may include a block decoder, a row decoder, a column decoder, an address buffer, etc.

The read/write circuit 130 may include a plurality of page buffers PB1 to PBm. The plurality of page buffers PB1 to PBm may be coupled to the memory cell array 110 through the bit lines BL1 to BLm. During the program operation, each of the page buffers PB1 to PBm may temporarily store program data DATA received from the controller 1200 of FIG. 1, and control a potential level of a corresponding one of the bit lines BL1 to BLm in accordance with the temporarily stored program data DATA.

The read/write circuit 130 may sense current or voltage of the bit lines BL1 to BLm during a verify operation of the program operation, and store a result of sensing as verify data.

The read/write circuit 130 may operate in response to page buffer control signals PB_signals output from the control logic 140.

In an embodiment, the read/write circuit 130 may include page buffers (or page registers), a column select circuit, etc.

The control logic 140 may be coupled to the address decoder 120, the read/write circuit 130, and the voltage generation circuit 150. The control logic 140 may receive a command CMD through an input/output buffer (not shown) of the semiconductor memory 100. The control logic 140 may control the overall operation of the semiconductor memory 100 in response to the command CMD, For example, the control logic 140 may receive a command CMD corresponding to a program operation, and then generate and output, in response to the received command CMD, address decoder control signals AD_signals for controlling the address decoder 120, page buffer control signals PB_signals for controlling the read/write circuit 130, and voltage generation circuit control signals VG_signals for controlling the voltage generation circuit 150.

In an embodiment of the present disclosure, when a command corresponding to a program operation is received from the controller 1200 of FIG. 1, the control logic 140 may control the peripheral circuit 160 to perform a program operation including a first program operation and a second program operation on memory cells coupled to selected word lines. Here, the control logic 140 may set a pass voltage to be applied to word lines adjacent to a selected word line such that a pass voltage to be applied during the first program operation differs from a pass voltage to be applied during the second program operation. For example, the control logic 140 may set a voltage to be applied to the word lines adjacent to the selected word line during the first program operation to a second pass voltage Vpass2 which is relatively high, and may set a voltage to be applied to the word lines adjacent to the selected word line during the second program operation to a third pass voltage Vpass3 which is relatively low. Furthermore, the control logic 140 may set a voltage to be applied to the other unselected word lines during the first and second program operations to a first pass voltage Vpass1. The second pass voltage Vpass2 may be a voltage higher than the third pass voltage Vpass3. The third pass voltage Vpass3 may be a voltage equal to or higher than the first pass voltage Vpass1. Furthermore, the control logic 140 may control the peripheral circuit 160 to perform a program voltage application operation for a first time during the first program operation and perform a program voltage application operation for a second time during the second program operation. The first time may be longer than the second time.

In an embodiment, the control logic 140 may control the peripheral circuit 160 to perform a program operation using an incremental step pulse programming (ISPP) scheme during a program operation on memory cells coupled to the selected word lines. During the program operation using the ISPP scheme, the control logic 140 may control the peripheral circuit 160 may control the peripheral circuit 160 to apply the second pass voltage to the word liens adjacent to the selected word line within a preset number of program loops and apply the third pass voltage to the word lines adjacent to the selected word line in a program loop after the preset number of program loops. Furthermore, the control logic 140 may control the peripheral circuit 160 to perform the program voltage application operation for a first time in the preset number of program loops and perform the program voltage application operation for a second time in a program loop after the preset number of program loops.

During the program operation, under control of voltage generation circuit control signals VG_signals output from the control logic 140, the voltage generation circuit 150 may generate a program voltage Vpgm, a plurality of pass voltages Vpass1, Vpass2, and Vpass3, and a plurality of verify voltages Vver1 and Vver2, and output the program voltage Vpgm, the plurality of pass voltages Vpass1, Vpass2, and Vpass3, and the plurality of verify voltages Vver1 and Vver2 to the address decoder 120.

Figure 3:
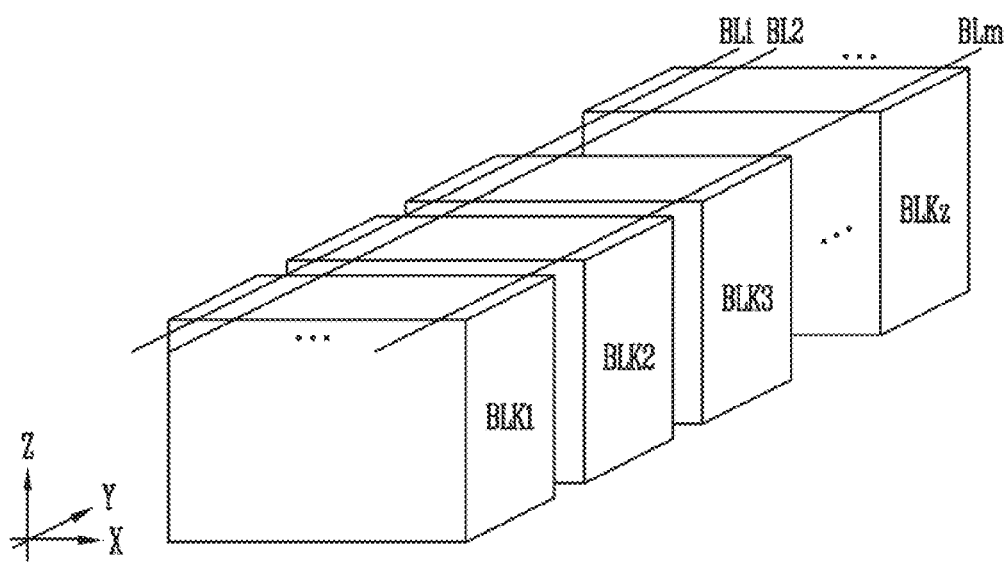
FIG. 3 is a diagram illustrating memory blocks each having a three-dimensional structure.

FIG. 3 is a diagram illustrating memory blocks each having a three-dimensional structure.

Referring to FIG. 3, the memory blocks BLK1 to BLKz each having a three-dimensional structure may be arranged at positions spaced apart from each other in a direction Y in which bit lines BL1 to BLm extend. For example, the first to z-th memory blocks BLK1 to BLKz may be arranged at positions spaced apart from each other in a second direction Y, and each may include a plurality of memory cells stacked in a third direction Z. Hereinbelow, the configuration of any one memory block of the first to z-th memory blocks BLK1 to BLKz will be described with reference to FIGS. 4 and 5.

Figure 4:
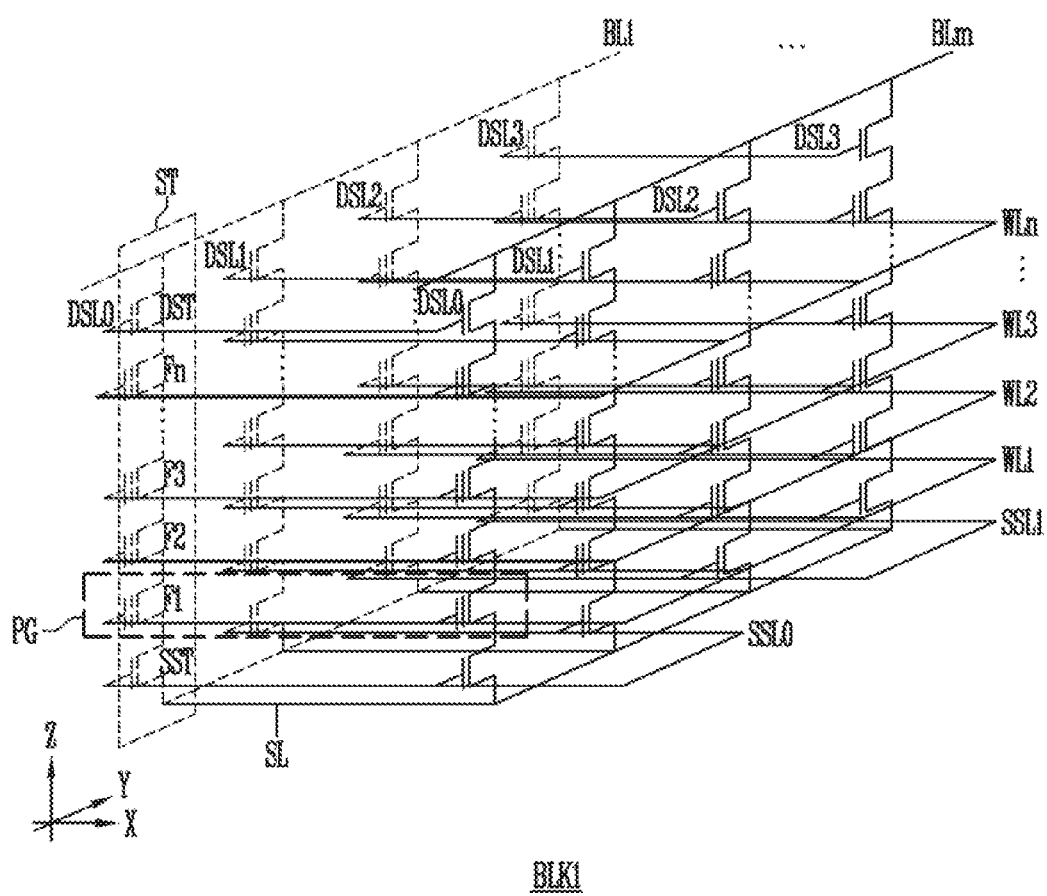
FIG. 4 is a circuit diagram for describing any one of the memory blocks illustrated in FIG. 3.

FIG. 4 is a circuit diagram for describing any one of the memory blocks illustrated in FIG. 3.

Referring to FIG. 4, a memory block BLK1 may include a plurality of memory strings ST. Each memory string ST may be coupled between the bit lines BL1 to BLm and a source line SL. The memory string ST coupled between the first bit line BL1 and the source line SL will be described below by way of example.

The memory string ST may include a source select transistor SST, memory cells F1 to Fn (n is a positive integer), and a drain select transistor DST, which are coupled in series to each other between the source line SL and the first bit line BL1. Gates of the source select transistors SST included in different memory strings ST coupled to the respective bit lines BL1 to BLm may be coupled to a first source select line SSL0 or a second source select line SSL1. For example, source select transistors disposed adjacent to each other in the second direction Y among the source select transistors SST may be coupled to the same source select line. For example, when it is assumed that the source select transistors SST are successively arranged in the second direction Y, the gates of the source select transistors SST that are arranged in the first direction X from the first source select transistor SST and included in different memory strings ST and the gates of the source select transistors SST that are arranged in the first direction X from the second source select transistor SST and included in different memory strings ST may be coupled to the first source select line SSL0. Furthermore, the gates of the source select transistors SST that are arranged in the first direction X from the third source select transistor SST and included in different memory strings ST and the gates of the source select transistors SST that are arranged in the first direction X from the fourth source select transistor SST and included in different memory strings ST may be coupled to the second source select line SSL1.

Gates of the memory cells F1 to Fn may be coupled to the word lines WL1 to WLn, and gates of the drain select transistors DST may be coupled to any one of the first to fourth drain select lines DSL0 to DSL3.

Although the gates of the transistors that are arranged in the first direction X among the drain select transistors DST are coupled in common to the same drain select line (e.g., DSL0), the transistors that are arranged in the second direction Y may be coupled to different drain select lines DSL1 to DSL3. For example, if it is assumed that the drain select transistors DST are successively arranged in the second direction Y, the gates of the drain select transistors DST that are arranged in the first direction X from the first drain select transistor DST and included in different memory strings ST may be coupled to the first drain select line DSL0. The drain select transistors DST that are arranged in the second direction Y from the drain select transistors DST coupled to the first drain select line DSL0 may be successively coupled to the second to fourth drain select lines DSL1 to DSL3. Therefore, in a selected memory block, memory strings ST coupled to a selected drain select line may be selected, and memory strings ST coupled to the other unselected drain select lines may be unselected.

Memory cells coupled to the same word lines may form a page PG. Here, the term "page" means a physical page. For example, a group of memory cells coupled in the first direction X in the same word line among the memory strings ST coupled to the first to m-th bit line BL1 to BLm may be referred to as "page PG". For example, the memory cells that are arranged in the first direction X among the first memory cells F1 coupled to the first word line WL1 may form one page PG. Cells arranged in the second direction Y among the first memory cells F1 coupled in common to the first word line WL1 may be separated into different pages. In FIG. 4, four memory strings are coupled to one bit line (e.g., BL1), so that four pages may be coupled to one word line. In the case where the first drain select line DSL0 is a selected drain select line and the first word line WL1 is a selected word line, a first page that is coupled to the first drain select line DSL0 among the four pages PG coupled to the first word line WL1 may become a selected page. Second to fourth pages that are coupled in common to the first word line WL1 and coupled to the unselected second to fourth drain select lines DSL1 to DSL3 may become unselected pages.

Figure 5:
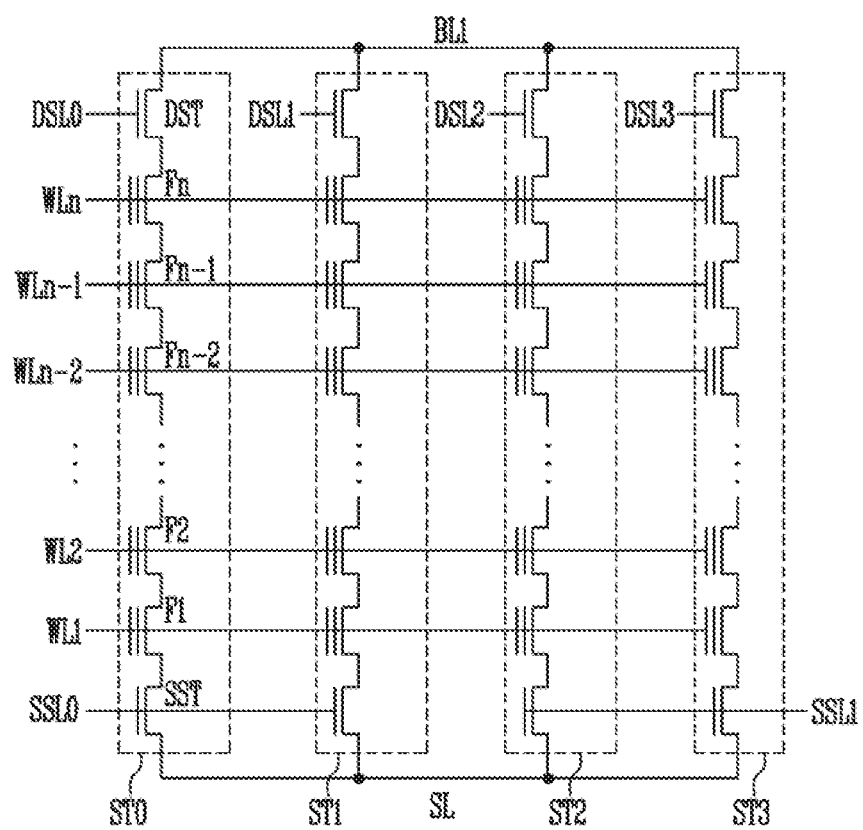
FIG. 5 is a circuit diagram illustrating memory strings illustrated in FIG. 4.

FIG. 5 is a circuit diagram illustrating memory strings illustrated in FIG. 4.

Referring to FIG. 5, a plurality of memory strings ST0 to ST3 may be coupled between the bit line BL1 and the source line SL. For the sake of explanation, in an embodiment of the present disclosure, the first to fourth memory strings ST0 to ST3 are illustrated and described, but the present disclosure is not limited thereto.

Each of the memory cell strings ST0 to ST3 may include a source select transistor SST, memory cells F1 to Fn (n is a positive integer), and a drain select transistor DST which are coupled in series to each other between the source line SL and the first bit line BL1. A gate of the drain select transistor DST of the first memory string ST0 may be coupled with a first drain select line DSL0. A gate of the drain select transistor DST of the second memory string ST1 may be coupled with the second drain select line DSL1. A gate of the drain select transistor DST of the third memory string ST2 may be coupled with the third drain select line DSL2. A gate of the drain select transistor DST of the fourth memory string ST3 may be coupled with the fourth drain select line DSL3. Gates of the source select transistors SST of the first and second memory strings ST0 and ST1 may be coupled with the first source select line SSL0. Gates of the source select transistors SST of the third and fourth memory strings ST2 and ST3 may be coupled with the second source select line SSL1.

Although in the drawing there is illustrated the case where one source select transistor SST and one drain select transistor DST are included in each memory string, a plurality of source select transistors SST and a plurality of drain select transistors DST may be included in each memory string depending on the configuration of the semiconductor memory device. Furthermore, depending on the configuration of the semiconductor memory device, dummy cells may be provided between the source select transistor SST, the memory cells F1 to Fn, and the drain select transistor DST. Apart from the normal memory cells F1 to Fn, the dummy cells might not store user data but may be used to improve electrical characteristics of each memory string. However, in an embodiment, the dummy cells might not be significant components; therefore, detailed description thereof will be omitted.

Figure 6:
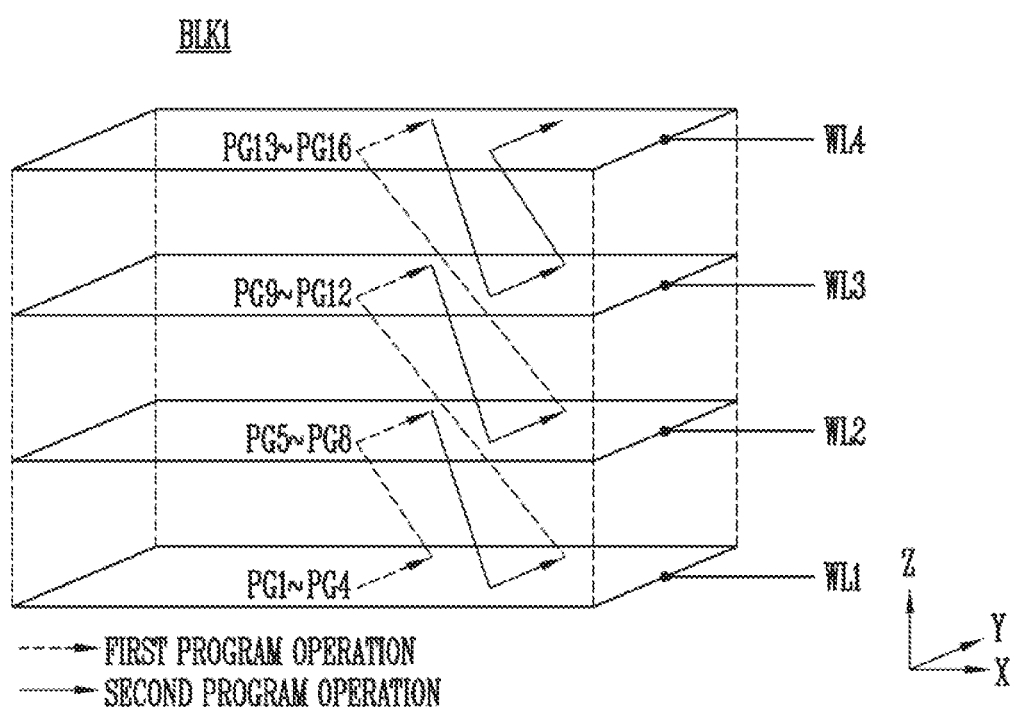
FIG. 6 is a diagram illustrating a method of performing a program operation in accordance with an embodiment of the present disclosure.

FIG. 6 is a diagram illustrating a method of performing a program operation in accordance with an embodiment of the present disclosure.

For the sake of simplification of the drawing and convenience in explanation, it is assumed that the memory block BLK1 includes four word lines WL1 to WL4, and each of the word lines WL1 to WL4 is coupled with four pages PG1 to PG4, PG5-PG8, PG9-PG12, PG13-PG16.

Referring to FIG. 6, a program operation on the memory block BLK1 may start from the pages PG1 to PG4 of the first word line WL1 and end with the pages PG13 to PG16 of the fourth word line WL4.

For example, the program operation on the memory block BLK1 may be performed in a sequence of a first program operation on the first to fourth pages PG1 to PG4 of the first word line WL1, a first program operation on the fifth to eighth pages PG5 to PG8 of the second word line WL2, a second program operation on the first to fourth pages PG1 to PG4 of the first word line WL1, a first program operation on the ninth to twelfth pages PG9 to PG12 of the third word line WL3, a second program operation on the fifth to eighth pages PG5 to PG8 of the second word line WL2, a first program operation on the thirteenth to sixteenth pages PG13 to PG16 of the fourth word line WL4, a second program operation on the ninth to twelfth pages PG9 to PG12 of the third word line WL3, and a second program operation on the thirteenth to sixteenth pages PG13 to PG16 of the fourth word line WL4. Consequently, data may be programmed on each of the first to sixteenth pages PG1 to PG16 of the first to fourth word lines WL1 to WL4.

The first program operations or the second program operations on the plurality of pages corresponding to each word line may be sequentially performed. For example, the respective first program operations of the first to fourth pages PG1 to PG4 of the first word line WL1 may be sequentially performed. The respective second operations of the first to fourth pages PG1 to PG4 of the first word line WL1 may be sequentially performed.

Here, the first program operation to be performed on each of the first to fourth word lines WL1 to WL4 may be referred to as a foggy program operation, and the second program operation to be performed on each of the first to fourth word lines WL1 to WL4 may be referred to as a fine program operation. Here, data to be stored during the first program operation on any word line is the same as data to be stored during the second program operation thereon, but the present disclosure is not limited thereto. The reason why the same data is programmed twice on the pages of each of the word lines WL1 to WL4 is as follows.

With an increase in capacity of the semiconductor memory 100, the size of data to be stored in one memory cell is also gradually increased. Recently, use of a quad level cell (QLC) scheme in which four bits of data can be stored in one memory cell has been increased. Furthermore, due to high integration of the memory cell array 110, the distance between signal lines (word lines and bit lines) has been reduced. Consequently, when a program operation is performed on a word line, interference may occur on other word lines adjacent to the word line on which the program operation is being performed; for example, the interference may occur on a previous word line on which the program operation has been completed, whereby data that is pre-stored in the previous word line may be damaged. Here, the words "the pre-stored data is damaged" may mean that the threshold voltage distribution of memory cells coupled to the previous word line is deformed.

To overcome the foregoing problem, in a program operation using the QLC scheme, a first program operation (i.e., a foggy program operation) of storing first data in first memory cells coupled to a first word line among a plurality of word lines may be performed, and a first program operation (i.e., a foggy program operation) of storing second data in second memory cells coupled to a subsequent word line, e.g., a second word line, adjacent to the first word line may be performed, and then a second program operation (i.e., a fine program operation) of storing the first data in the first memory cells of the first word line again may be performed.

Figure 9:
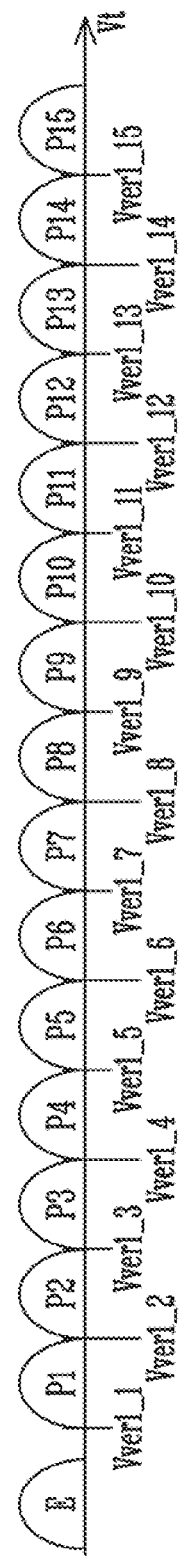
FIG. 9 is a diagram illustrating threshold voltage distributions of memory cells for describing the first program operation.
Figure 13:
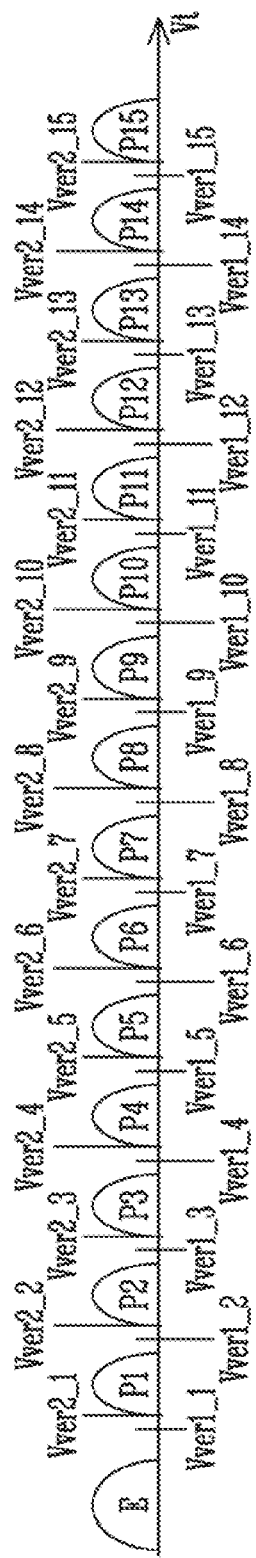
FIG. 13 is a diagram illustrating threshold voltage distributions of memory cells for describing the second program operation.

For example, as illustrated in FIG. 9, the threshold voltage distributions of the memory cells on which the first program operation has been performed might not be clearly separated from each other. In other words, portions on which the respective threshold voltage distributions overlap with each other may occur. On the other hand, as illustrated in FIG. 13, the threshold voltage distributions of the memory cells on which the second program operation has been performed may be clearly separated from each other. In this case, the threshold voltage distributions may be completely separated from each other without overlapping with each other.

In other words, the threshold voltage distribution of memory cells coupled to a previous word line is deformed by interference due to a program operation performed on a subsequent word line. Given this, the first program operation on the previous word line may be performed such that the threshold voltage distribution of the memory cells has a shape similar to a desired threshold voltage distribution. Thereafter, if a first program operation on a subsequent word line is completed, a second program operation on the previous word line may be performed such that the threshold voltage distribution of the memory cells coupled to the previous word line has a desired threshold voltage distribution. For example, a verify operation of the first program operation may be performed using a pre-threshold voltage lower than a target threshold voltage so that the memory cells may be programmed to a state having a voltage higher than the pre-threshold voltage. A verify operation of the second program operation may be performed using a target threshold voltage so that the memory cells may be programmed to a state having a voltage higher than the target threshold voltage.

Figure 7:
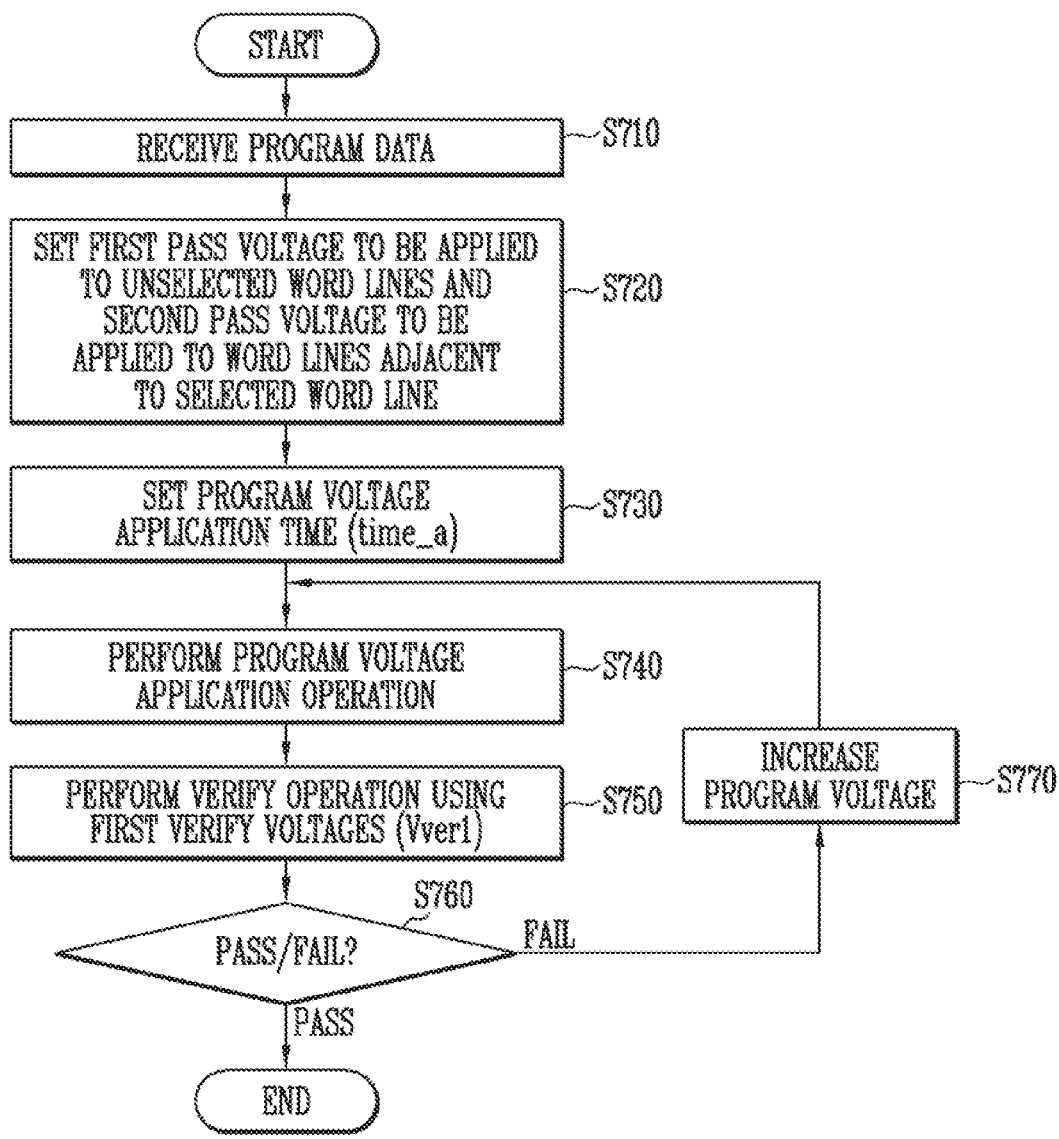
FIG. 7 is a flowchart for describing a first program operation of the program operation in accordance with an embodiment of the present disclosure.

FIG. 7 is a flowchart for describing a first program operation of the program operation in accordance with an embodiment of the present disclosure.

Figure 8:
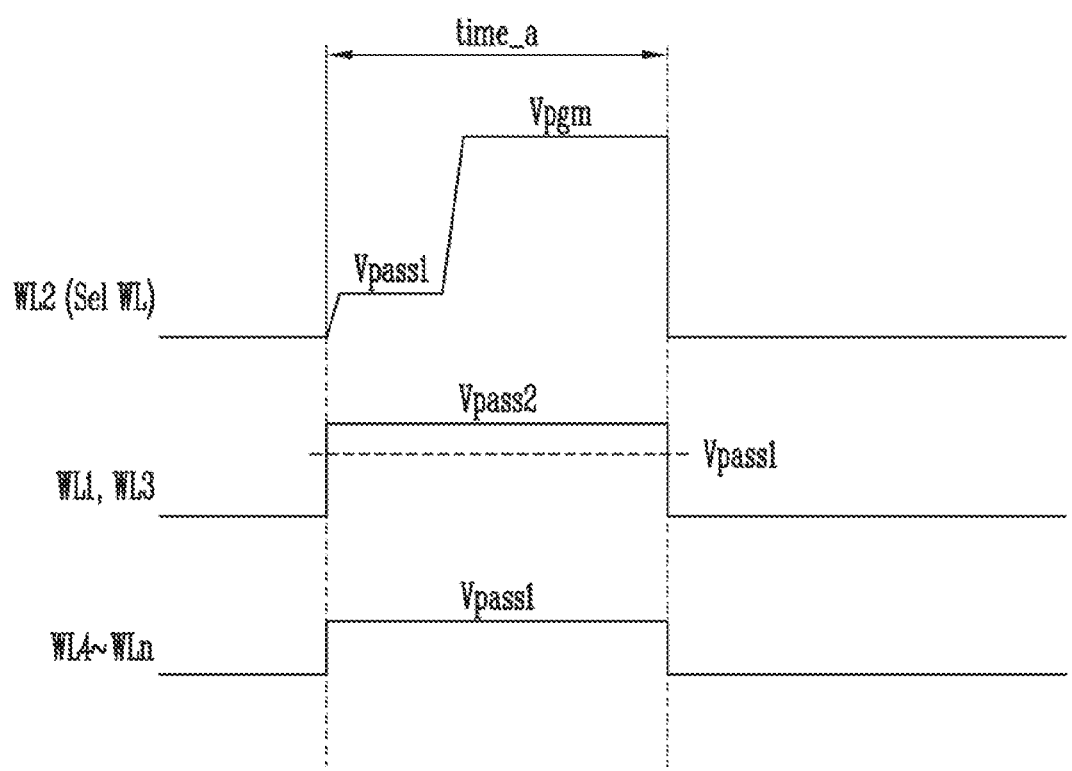
FIG. 8 is a voltage waveform diagram for describing a program voltage application operation during the first program operation.

FIG. 8 is a voltage waveform diagram for describing a program voltage application operation during the first program operation.

FIG. 9 is a diagram illustrating threshold voltage distributions of memory cells for describing the first program operation.

The first program operation of the program operation in accordance with an embodiment of the present disclosure will be described with reference to FIGS. 2 to 9.

In an embodiment, for the sake of explanation, a first program operation on any one page of the fifth to eighth pages PG5 to PG8 coupled to the second word line WL2 will be described.

At step S710, the read/write circuit 130 may receive program data DATA from the controller 1200 of FIG. 1 and temporarily store the program data DATA, and control potential levels of the bit lines BL1 to BLm based on the temporarily stored program data DATA.

At step S720, the control logic 140 may set a first pass voltage Vpass1 to be applied to the unselected word lines WL4 to WLn during the first program operation, and a second pass voltage Vpass2 to be applied to the word lines WL1 and WL3 adjacent to the selected word line WL2. The second pass voltage Vpass2 may be higher than the first pass voltage Vpass1.

At step S730, the control logic 140 may set a program voltage application time during the first program operation to a first time time_a. The first time time_a may be a time which is longer than a program voltage application time time_b during a second program operation, which will be described later herein.

At step S740, the peripheral circuit 160 may perform a program voltage application operation for the first time time_a. For example, the voltage generation circuit 150 may generate and output a program voltage Vpgm, a first pass voltage Vpass1, and a second pass voltage Vpass2 under control of voltage generation circuit control signals VG_signals output from the control logic 140.

The address decoder 120 may apply the program voltage Vpgm generated from the voltage generation circuit 150 to the word line WL2, apply the first pass voltage Vpass1 to the unselected word lines WL4 to WLn, and apply the second pass voltage Vpass2 to the word lines WL1 and WL3 adjacent to the selected word line WL2. The first pass voltage Vpass1 may be applied to the selected word line WL2 before the program voltage Vpgm is applied to the selected word line WL2.

At step S750, the peripheral circuit 160 may perform a verify operation using first verify voltages Vver1 (Vver1_1 to Vver1_15). The first verify voltages Vver1 (Vver1_1 to Vver1_15) may be pre-threshold voltages lower than target threshold voltages of the program operation.

Verify operations may be sequentially performed for a plurality of programmed states P1 to P15 among an erased state E and the plurality of programmed states P1 to P15 of quad level cells QLC.

For example, the voltage generation circuit 150 may generate a first verify voltage Vver1_1 and a first pass voltage Vpass1 under control of voltage generation circuit control signals VG_signals output from the control logic 140. The address decoder 120 may apply the first verify voltage Vver1_1 generated from the voltage generation circuit 150 to the selected word line WL2 and apply the first pass voltage Vpass1 to the unselected word lines WL1 and WL3 to WLn. The read/write circuit 130 may perform a verify operation for the first programmed state P1 by sensing current or voltage of the bit lines BL1 to BLm.

After the verify operation for the first programmed state P1, the first verify voltage Vver1_2 may be applied to the selected word line WL2, and then a verify operation for the second programmed state P2 may be performed by sensing current or voltage of the bit lines BL1 to BLm. Likewise, verify operations for the other third to fifteenth programmed states P3 to P15 may be sequentially performed.

At step S760, a result of the verify operation may be determined. For example, it may be determined whether a preset number or more of memory cells among the memory cells included in the selected page have been programmed to the programmed states P1 to P15 corresponding to the program data DATA.

If at step S760 the result of the verify operation indicates a failure (FAIL), the control logic 140 may set, at step S770, the program voltage Vpgm to a value increased by a step voltage, and control the peripheral circuit 160 to re-perform the process from step S740.

If at step S760 the result of the verify operation indicates a success (PASS), the first program operation on the selected page may be terminated.

Figure 10:
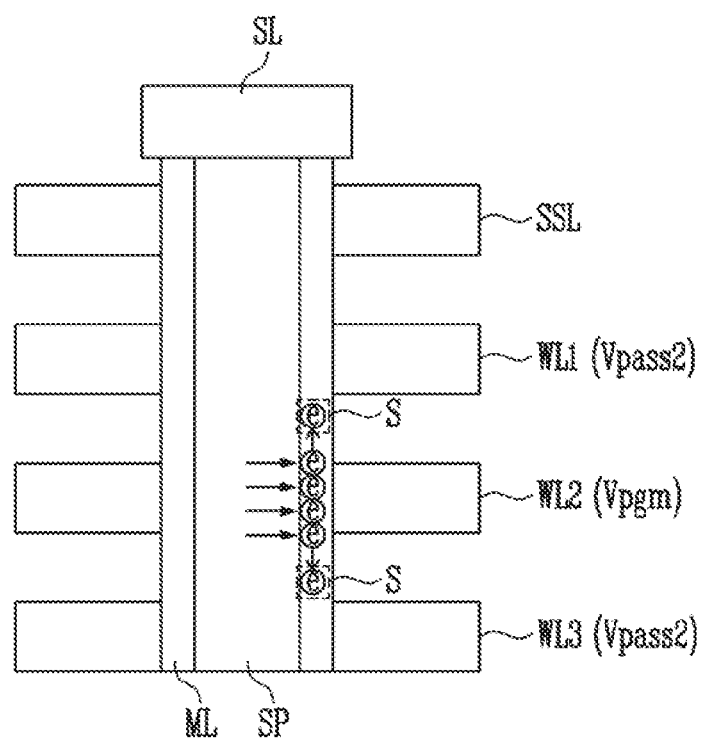
FIG. 10 is a diagram for describing movement of charges trapped in a memory layer of a memory cell during the first program operation.

FIG. 10 is a diagram for describing movement of charges trapped in a memory layer of a memory cell during the first program operation.

Referring to FIG. 10, when the program voltage Vpgm is applied to the selected word line WL2 during the program voltage application operation of the first program operation, charges (ⓔ) may be drawn from a vertical channel layer SP into a memory layer ML of the memory cell and trapped in the memory layer ML. Thereby, the threshold voltage of the selected memory cell may be increased. Furthermore, the pass voltage Vpass2 higher than that of the second program operation may be applied to the word lines WL1 and WL3 adjacent to the selected word line WL, so that some charges of the charges (ⓔ) trapped in the memory layer ML of the selected memory cell may be moved to memory layer areas S extending toward the memory cells adjacent to the selected memory cell and then trapped in the memory layer areas S. In other words, the charges trapped in the memory layer ML of the selected memory cell may be moved and diffused in a direction toward the source line SL and in a direction opposite to the source line SL. Furthermore, since the program voltage application operation of the first program operation is performed for a time longer than that of the program voltage application operation of the second program operation, charges (ⓔ) may be more easily moved into the extended memory layer areas S.

As described above, during the first program operation, a relatively high pass voltage is applied to the word lines adjacent to the selected word line, so that some charges of the charges (ⓔ) trapped in the memory layer ML of the selected memory cell may be diffused into the memory layer areas S extending toward the memory cells adjacent to the selected memory cell. Consequently, even if a predetermined time has passed after the first and second program operations have been completed, the charges (ⓔ) trapped in the selected memory cell might not move into the memory layer areas S because charges (ⓔ) have been already trapped in the memory layer areas S disposed between the selected memory cell and the memory cells adjacent to the selected memory cell. Thereby, retention characteristics of the memory cell may be improved. The word "predetermined" as used herein with respect to a parameter, such as a predetermined time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 11:
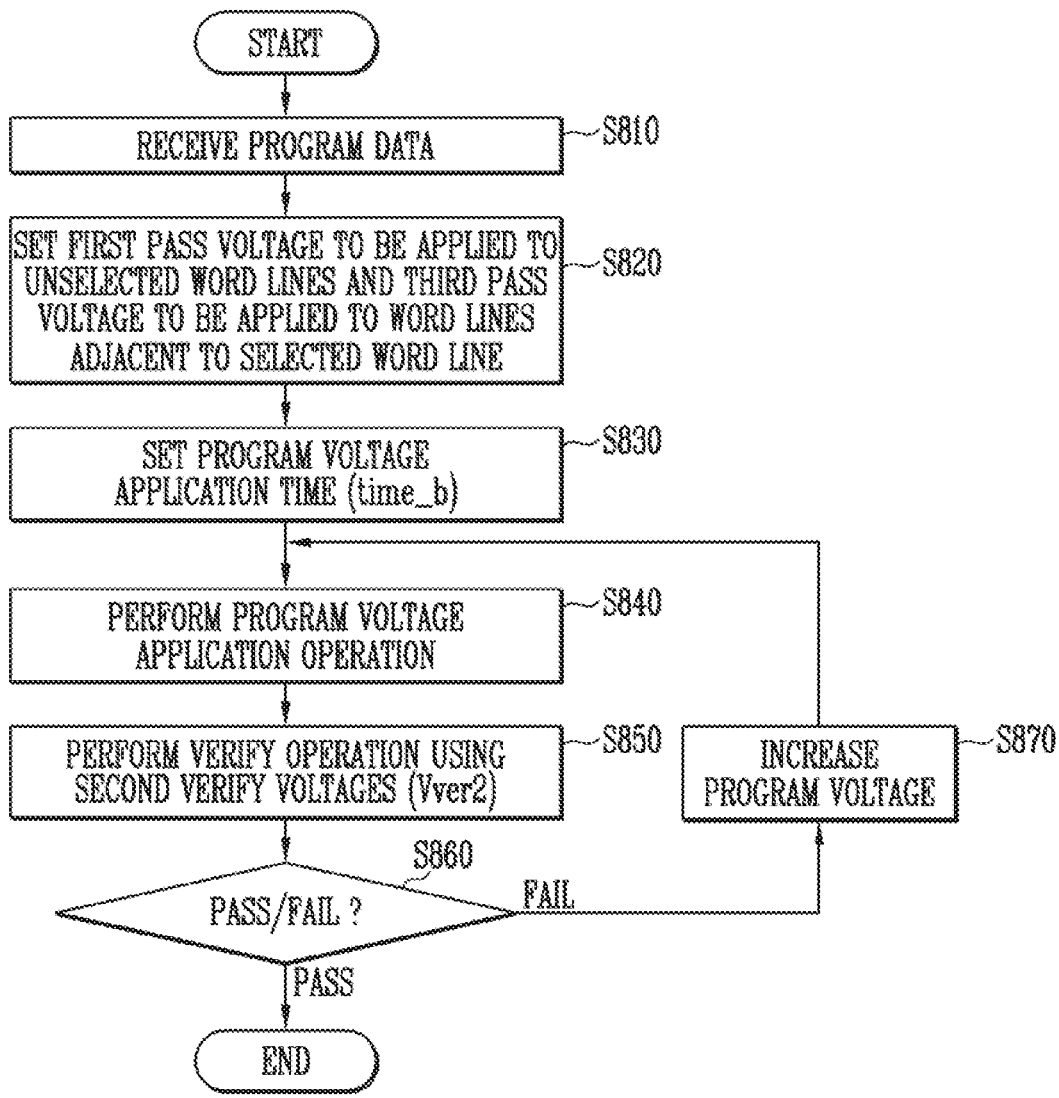
FIG. 11 is a flowchart for describing a second program operation of the program operation in accordance with an embodiment of the present disclosure.

FIG. 11 is a flowchart for describing a second program operation of the program operation in accordance with an embodiment of the present disclosure.

Figure 12:
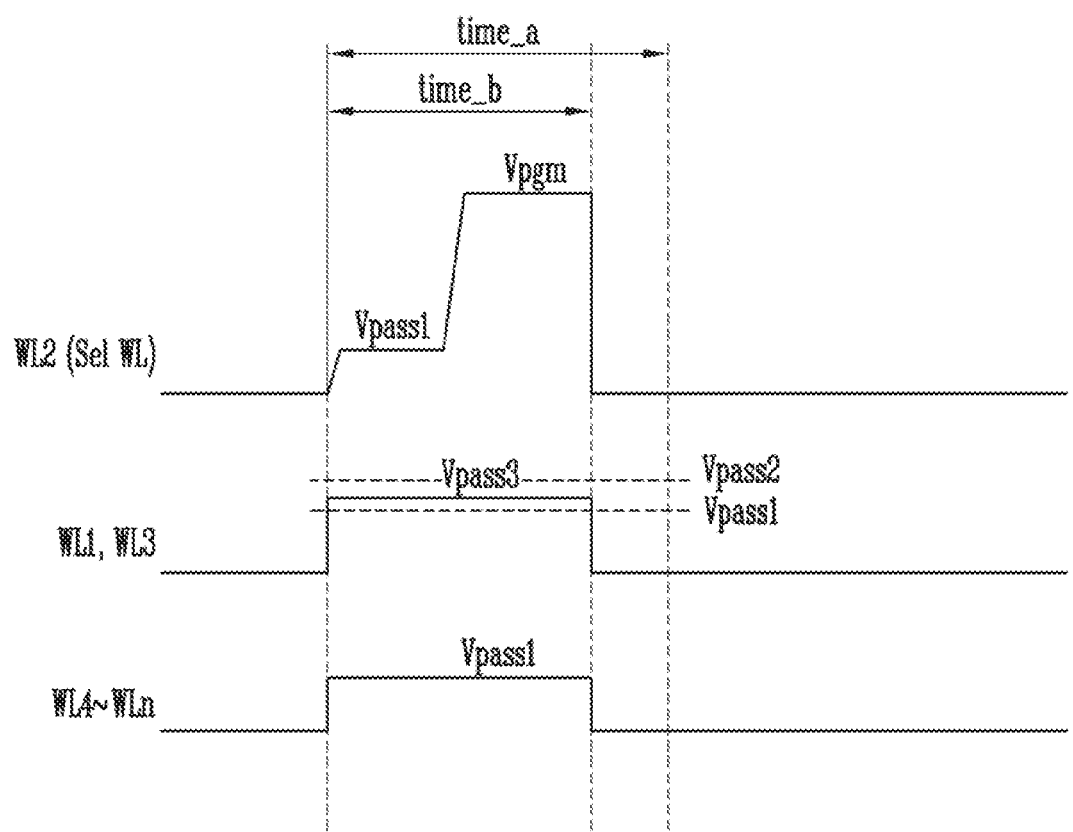
FIG. 12 is a voltage waveform diagram for describing a program voltage application operation during the second program operation.

FIG. 12 is a voltage waveform diagram for describing a program voltage application operation during the second program operation.

FIG. 13 is a diagram illustrating threshold voltage distributions of memory cells for describing the second program operation.

The second program operation of the program operation in accordance with an embodiment of the present disclosure will be described with reference to FIGS. 2 to 6 and 11 to 13.

In an embodiment, for the sake of explanation, a second program operation on any one page of the fifth to eighth pages PG5 to PG8 coupled to the second word line WL2 will be described.

At step S810, the read/write circuit 130 may receive program data DATA from the controller 1200 of FIG. 1 and temporarily store the program data DATA, and control potential levels of the bit lines BL1 to BLm based on the temporarily stored program data DATA. The program data DATA may be data identical with the program data received during the first program operation.

At step S820, the control logic 140 may set a first pass voltage Vpass1 to be applied to the unselected word lines WL4 to WLn during the second program operation, and a third pass voltage Vpass3 to be applied to the word lines WL1 and WL3 adjacent to the selected word line WL2. The third pass voltage Vpass3 may be a voltage lower than the second pass voltage Vpass2 of the first program operation. The third pass voltage Vpass2 may be equal to or higher than the first pass voltage Vpass1.

At step S830, the control logic 140 may set a program voltage application time during the second program operation to a second time time_b. The second time time_b may be a time which is shorter than a program voltage application time time_a during the first program operation.

At step S840, the peripheral circuit 160 may perform a program voltage application operation for the second time time_b. For example, the voltage generation circuit 150 may generate and output a program voltage Vpgm, a first pass voltage Vpass1, and a third pass voltage Vpass3 under control of voltage generation circuit control signals VG_signals output from the control logic 140.

The address decoder 120 may apply the program voltage Vpgm generated from the voltage generation circuit 150 to the word line WL2, apply the first pass voltage Vpass1 to the unselected word lines WL4 to WLn, and apply the third pass voltage Vpass3 to the word lines WL1 and WL3 adjacent to the selected word line WL2. The first pass voltage Vpass1 may be applied to the selected word line WL2 before the program voltage Vpgm is applied to the selected word line WL2.

At step S850, the peripheral circuit 160 may perform a verify operation using second verify voltages Vver2 (Vver2_1 to Vver2_15). The second verify voltages Vver2 (Vver2_1 to Vver2_15) may be target threshold voltages of the program operation. The second verify voltages Vver2 (Vver2_1 to Vver2_15) may voltages higher than the first verify voltages Vver1 (Vver1_1 to Vver1_15) of the first program operation.

Verify operations may be sequentially performed for a plurality of programmed states P1 to P15 among an erased state E and the plurality of programmed states P1 to P15 of quad level cells QLC.

For example, the voltage generation circuit 150 may generate a second verify voltage Vver2_1 and a first pass voltage Vpass1 under control of voltage generation circuit control signals VG_signals output from the control logic 140. The address decoder 120 may apply the second verify voltage Vver2_1 generated from the voltage generation circuit 150 to the selected word line WL2 and apply the first pass voltage Vpass1 to the unselected word lines WL1 and WL3 to WLn. The read/write circuit 130 may perform a verify operation for the first programmed state P1 by sensing current or voltage of the bit lines BL1 to BLm.

After the verify operation for the first programmed state P1, the second verify voltage Vver2_2 may be applied to the selected word line WL2, and then a verify operation for the second programmed state P2 may be performed by sensing current or voltage of the bit lines BL1 to BLm. Likewise, verify operations for the other third to fifteenth programmed states P3 to P15 may be sequentially performed.

At step S860, a result of the verify operation may be determined. For example, it may be determined whether a preset number or more of memory cells among the memory cells included in the selected page have been programmed to the programmed states P1 to P15 corresponding to the program data DATA.

If at step S860 the result of the verify operation indicates a failure (FAIL), the control logic 140 may set, at step S870, the program voltage Vpgm to a value increased by a step voltage, and control the peripheral circuit 160 to re-perform the process from step S840.

If at step S860 the result of the verify operation indicates a success (PASS), the second program operation on the selected page may be terminated.

As described above, in an embodiment of the present disclosure, a first program operation and a second program operation may be performed on a selected page during a program operation. A pass voltage to be applied to a word line adjacent to a selected word line during the first program operation may be set to a value higher than a pass voltage to be applied to the word line adjacent to the selected word line during the second program operation. Hence, charges may be diffused into and trapped in memory layer areas between memory cells during the first program operation. Thus, even if a predetermined time has passed after the first and second program operations have been completed, the charges (ⓔ) trapped in the memory cells might not move into the memory layer areas S disposed between the memory cells because charges (ⓔ) have been already trapped in the memory layer areas S between the memory cells. As a result, the retention characteristics of the memory cells may be improved.

In the foregoing embodiments of the present disclosure, there are illustrated examples in which the pass voltage to be applied to the word lines adjacent to the selected word line during the first program operation is set to a value higher than the pass voltage to be applied to the word lines adjacent to the selected word line during the second program operation, and a program voltage application time of the first program operation is set to a value greater than a program voltage application time of the second program operation. However, in an embodiment, the pass voltage to be applied to the word lines adjacent to the selected word line during the second program operation may be set to a value higher than the pass voltage to be applied to the word lines adjacent to the selected word line during the first program operation. Also, the program voltage application time of the second program operation may be set to a value greater than a program voltage application time of the first program operation.

In the foregoing embodiments of the present disclosure, there are illustrated examples in which the pass voltage to be applied to the word lines adjacent to the selected word line during the first program operation is set to a value higher than the pass voltage to be applied to the word lines adjacent to the selected word line during the second program operation, and a program voltage application time of the first program operation is set to a value greater than a program voltage application time of the second program operation. However, in an embodiment, only in a preset number of program loops, e.g., m program loops (m is a positive integer) including an initial program loop to m-th program loop, among a plurality of program loops included in the first program operation, a pass voltage to be applied to the word lines adjacent to the selected word line may be set to a value higher than a pass voltage to be applied to the word lines adjacent to the selected word line during the second program operation. Also, only in m program loops (m is a positive integer) including the initial program loop to m-th program loop, the program voltage application time may be set to a value greater than the program voltage application time of the second program operation. Each program loop may include a program voltage application operation and a verify operation. The word "preset" as used herein with respect to a parameter, such as a preset number of loops or preset number, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 14:
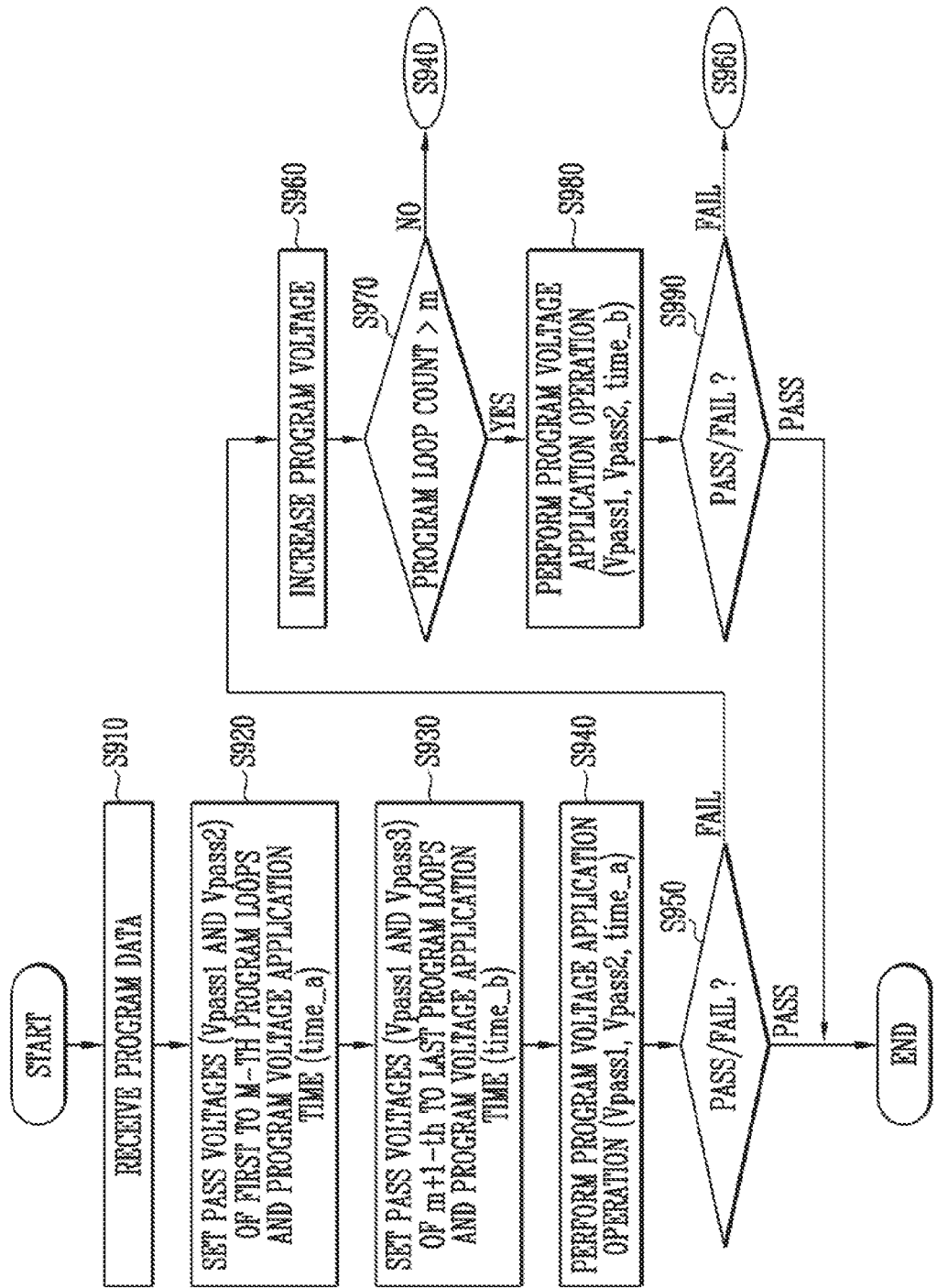
FIG. 14 is a flowchart for describing a program operation in accordance with an embodiment of the present disclosure.

FIG. 14 is a flowchart for describing a program operation in accordance with an embodiment of the present disclosure.

Figure 15:
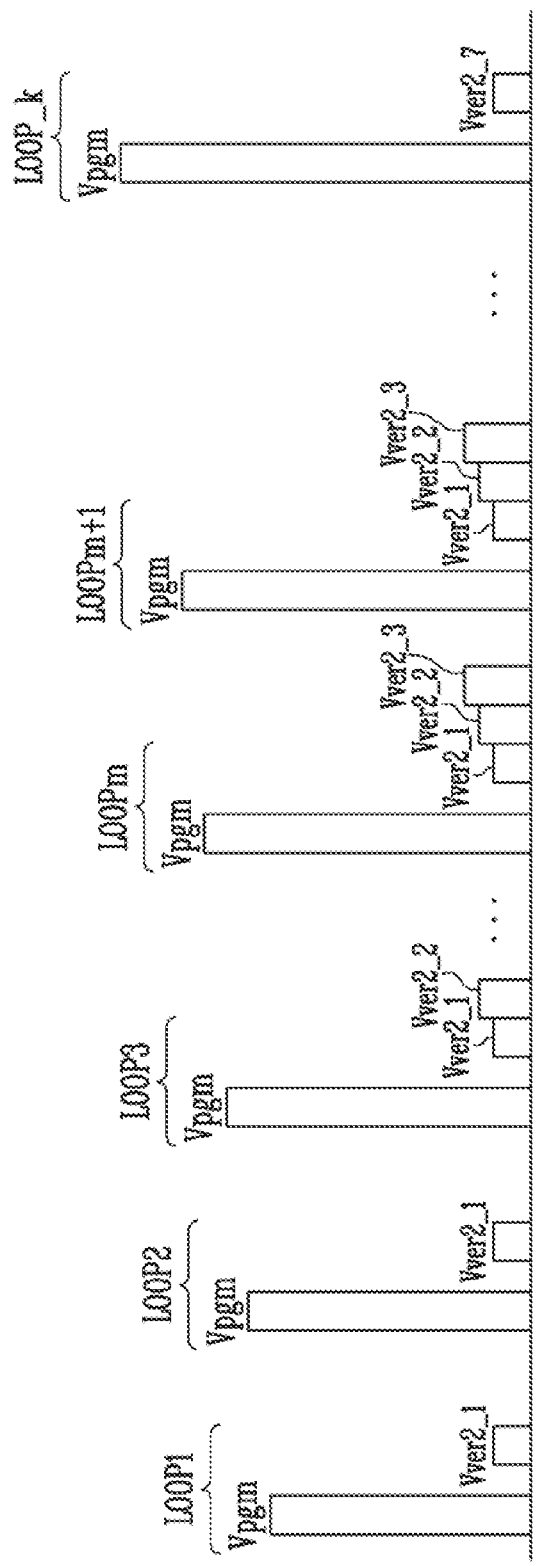
FIG. 15 is a diagram for describing a program loop of a program operation in accordance with an embodiment of the present disclosure.

FIG. 15 is a diagram for describing a program loop of a program operation in accordance with an embodiment of the present disclosure.

Figure 16:
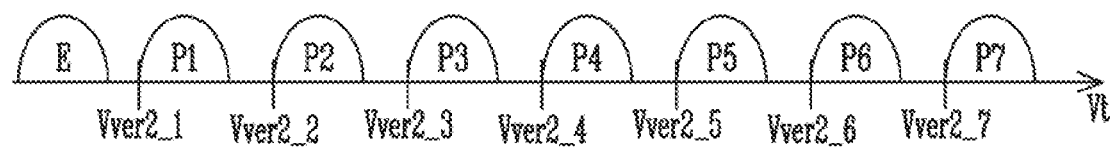
FIG. 16 is a diagram illustrating threshold voltage distributions of memory cells to describe the program operation in accordance with an embodiment of the present disclosure.

FIG. 16 is a diagram illustrating threshold voltage distributions of memory cells to describe the program operation in accordance with an embodiment of the present disclosure.

In an embodiment of the present disclosure, for the sake of explanation, a triple level cell (TLC) program operation on any one page of the fifth to eighth pages PG5 to PG8 coupled to the second word line WL2 will be described.

At step S910, the read/write circuit 130 may receive program data DATA from the controller 1200 of FIG. 1 and temporarily store the program data DATA, and control potential levels of the bit lines BL1 to BLm based on the temporarily stored program data DATA.

At step S920, the control logic 140 may set pass voltages and a program voltage application time in first to m-th program loops among a plurality of program loops included in the program operation. For example, the control logic 140 may set a first pass voltage Vpass1 to be applied to the unselected word lines WL4 to WLn during the first to m-th program loops, and a second pass voltage Vpass2 to be applied to the word lines WL1 and WL3 adjacent to the selected word line WL2. The second pass voltage Vpass2 may be higher than the first pass voltage Vpass1. Furthermore, the control logic 140 may set a program voltage application time in the first to m-th program loops to a first time time_a.

At step S930, the control logic 140 may set pass voltages and a program voltage application time in m+1-th to last program loops LOOPm+1 to LOOPk among the plurality of program loops included in the program operation. For example, the control logic 140 may set a first pass voltage Vpass1 to be applied to the unselected word lines WL4 to WLn during the m+1-th to last program loops LOOPm+1 to LOOPk, and a third pass voltage Vpass3 to be applied to the word lines WL1 and WL3 adjacent to the selected word line WL2. The third pass voltage Vpass3 may be a voltage lower than the second pass voltage Vpass2. The third pass voltage Vpass2 may be equal to or higher than the first pass voltage Vpass1. Furthermore, the control logic 140 may set a program voltage application time in the m+1-th to last program loops LOOPm+1 to LOOPk to a second time time_b. The second time time_b may be shorter than the first time time_a.

At step S940, a program voltage application operation may be performed. For example, the peripheral circuit 160 may perform the program voltage application operation for the first time time_a. For example, the voltage generation circuit 150 may generate and output a program voltage Vpgm, a first pass voltage Vpass1, and a second pass voltage Vpass2 under control of voltage generation circuit control signals VG_signals output from the control logic 140.

The address decoder 120 may apply the program voltage Vpgm generated from the voltage generation circuit 150 to the word line WL2, apply the first pass voltage Vpass1 to the unselected word lines WL4 to WLn, and apply the second pass voltage Vpass2 to the word lines WL1 and WL3 adjacent to the selected word line WL2. The first pass voltage Vpass1 may be applied to the selected word line WL2 before the program voltage Vpgm is applied to the selected word line WL2.

At step S950, a verify operation may be performed, and a result of the verify operation may be determined. For example, the peripheral circuit 160 may perform a verify operation using second verify voltages Vver2. The second verify voltages may be target threshold voltages.

In an initial program loop, a program verify operation may be performed only for program states having low threshold voltage distributions among a plurality of programmed states to reduce a program operation time. For example, in a first program loop LOOP1 and a second program loop LOOP2, a verify operation using a second verify voltage Vver2_1 may be performed to verify the first programmed state P1. In a third program loop LOOP3, a verify operation using second verify voltages Vver2_1 and Vver2_2 may be performed to verify the first and second programmed states P1 and P2. In an m-th program loop LOOPm, a verify operation using second verify voltages Vver2_1, Vver2_2, and Vver2_3 may be performed to verify the first to third programmed states P1 to P3.

Based on a result of the verify operation, it may be determined whether a preset number or more of memory cells among the memory cells included in the selected page have been programmed to the programmed states P1 to P7 corresponding to the program data DATA.

At step S950, if the result of the verify operation indicates a success (PASS), the program operation on the selected page may be terminated. If the result of the verify operation indicates a failure (FAIL), the control logic 140 may increase the program voltage Vpgm by a step voltage, at step S960.

At step S970, the control logic 140 may determine whether a number of times program loops have been performed exceeds a preset count (m; m is a positive integer). If the number of times the program loops have been performed is equal to or less than the preset count m (as shown by "NO"), the process may be re-performed from step S940.

At step S970, if the number of times the program loops have been performed is greater than the preset count m (as shown by "YES"), a program voltage application operation may be performed, at step S980. For example, the peripheral circuit 160 may perform the program voltage application operation for the second time time_b. For example, the voltage generation circuit 150 may generate and output a program voltage Vpgm, a first pass voltage Vpass1, and a third pass voltage Vpass3 under control of voltage generation circuit control signals VG_signals output from the control logic 140.

The address decoder 120 may apply the program voltage Vpgm generated from the voltage generation circuit 150 to the word line WL2, apply the first pass voltage Vpass1 to the unselected word lines WL4 to WLn, and apply the third pass voltage Vpass3 to the word lines WL1 and WL3 adjacent to the selected word line WL2. The first pass voltage Vpass1 may be applied to the selected word line WL2 before the program voltage Vpgm is applied to the selected word line WL2.

At step S990, a verify operation may be performed, and a result of the verify operation may be determined. For example, the peripheral circuit 160 may perform a verify operation using second verify voltages Vver2. The second verify voltages may be target threshold voltages.

If a result of the verify operation indicates a failure (FAIL), the process may be re-performed from step S960. If the result of the verify operation indicates a success (PASS), the program operation on the selected page may be terminated.

As described above, in an embodiment of the present disclosure, a first program operation and a second program operation may be performed on a selected page during a program operation. A pass voltage to be applied to a word line adjacent to a selected word line during the first program operation may be set to a value higher than a pass voltage to be applied to the word line adjacent to the selected word line during the second program operation. Hence, charges may be diffused into and trapped in memory layer areas between memory cells during the first program operation. Thus, even if a predetermined time has passed after the first and second program operations have been completed, the charges ($\ominus$) trapped in the memory cells might not move into the memory layer areas S disposed between the memory cells because charges ($\ominus$) have been already trapped in the memory layer areas S between the memory cells. As a result, the retention characteristics of the memory cells may be improved.

In an embodiment of the present disclosure, a pass voltage to be applied to word lines adjacent to a selected word line in a preset program loop of a plurality of program loops included in a program operation may be set to a value higher than a pass voltage to be applied to the word lines adjacent to the selected word line in the other program loops. A program voltage application time of the selected program loop may be set to a value greater than a program voltage application time of each of the other program loops.

Hence, some of the charges trapped in a memory layer of a selected memory cell in the preset program loop may be diffused into memory layer areas extending toward memory cells adjacent to a selected memory cell. Therefore, even after a predetermined time has passed after the program operation has been completed, the charged trapped in the selected memory cell might not move into the memory layer areas extending toward the memory cells adjacent to the selected memory cell because charges have been already trapped in the memory layer areas disposed between the selected memory cell and the memory cells adjacent to the selected memory cell. Thereby, retention characteristics of the memory cell may be improved.

Figure 17:
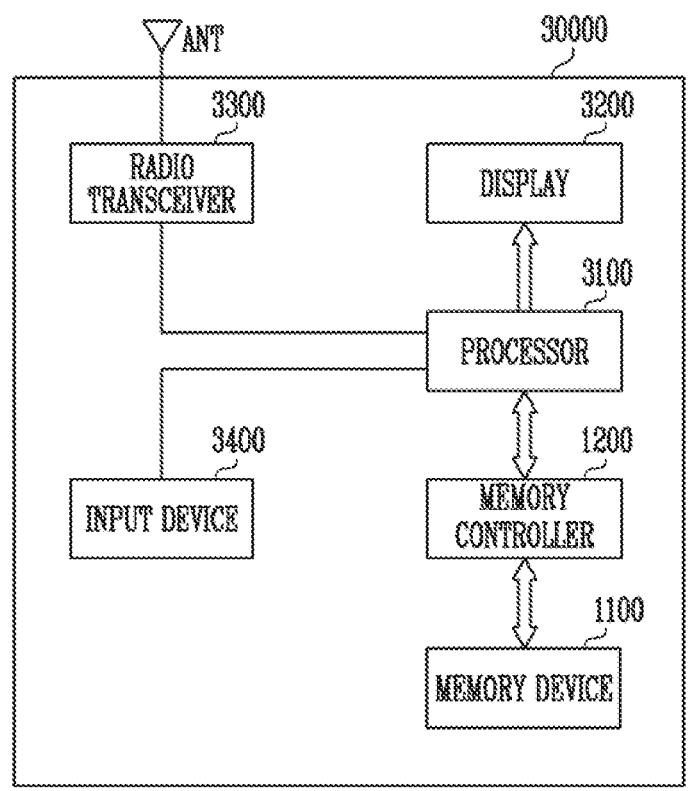
FIG. 17 is a diagram illustrating a memory system in accordance with an embodiment of the present disclosure.

FIG. 17 is a diagram illustrating a memory system 30000 in accordance with an embodiment of the present disclosure.

Referring to FIG. 17, the memory system 30000 may be embodied in a cellular phone, a smartphone, a tablet PC, a personal digital assistant (PDA) or a wireless communication device. The memory system 30000 may include a memory device 1100, and a controller 1200 capable of controlling the operation of the memory device 1100. The controller 1200 may control a data access operation, e.g., a program operation, an erase operation, or a read operation, of the memory device 1100 under control of a processor 3100.

Data programmed to the memory device 1100 may be output through a display 3200 under control of the controller 1200.

A radio transceiver 3300 may send and receive radio signals through an antenna ANT. For example, the radio transceiver 3300 may change a radio signal received through the antenna ANT into a signal capable of being processed in the processor 3100. Therefore, the processor 3100 may process a signal output from the radio transceiver 3300 and transmit the processed signal to the controller 1200 or the display 3200. The controller 1200 may program a signal processed by the processor 3100 to the memory device 1100. Furthermore, the radio transceiver 3300 may change a signal output from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be embodied in a pointing device such as a touch pad and a computer mouse, a keypad or a keyboard. The processor 3100 may control the operation of the display 3200 such that data output from the controller 1200, data output from the radio transceiver 3300, or data output form the input device 3400 is output through the display 3200.

In an embodiment, the controller 1200 capable of controlling the operation of the memory device 1100 may be embodied as a part of the processor 3100 or a chip provided separately from the processor 3100. The controller 1200 may be embodied by an example of the controller 1200 shown in FIG. 1.

Figure 18:
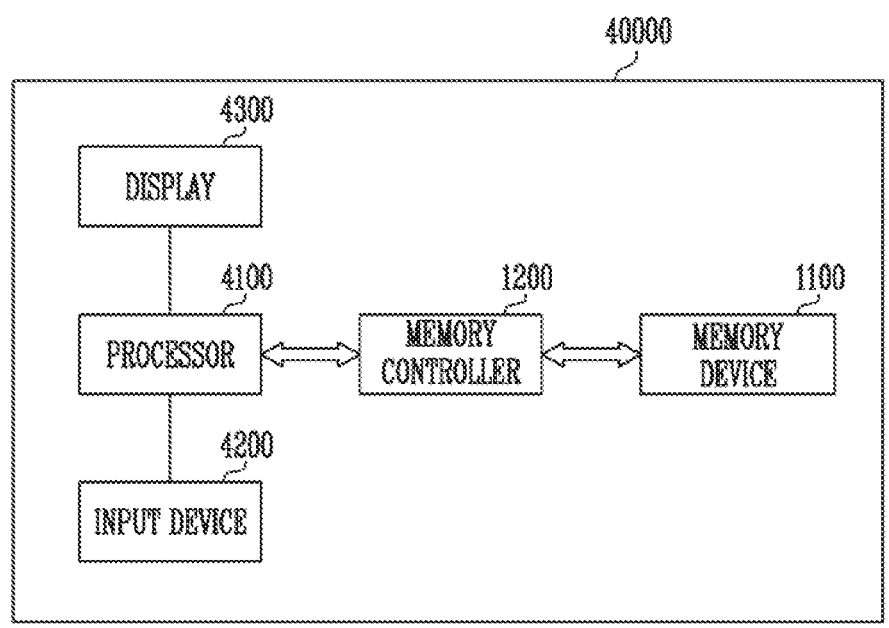
FIG. 18 is a diagram illustrating a memory system in accordance with an embodiment of the present disclosure.

FIG. 18 is a diagram illustrating a memory system 40000 in accordance with an embodiment of the present disclosure.

Referring to FIG. 18, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include a memory device 1100, and a controller 1200 configured to control the data processing operation of the memory device 1100.

A processor 4100 may output data stored in the memory device 1100 through a display 4300, according to data inputted from an input device 4200. For example, the input device 4200 may be embodied in a pointing device such as a touch pad or a computer mouse, a keypad, or a keyboard.

The processor 4100 may control the overall operation of the memory system 40000 and control the operation of the controller 1200. In an embodiment, the controller 1200 capable of controlling the operation of the memory device 1100 may be embodied as a part of the processor 4100 or a chip provided separately from the processor 4100. The controller 1200 may be embodied by an example of the controller 1200 shown in FIG. 1.

Figure 19:
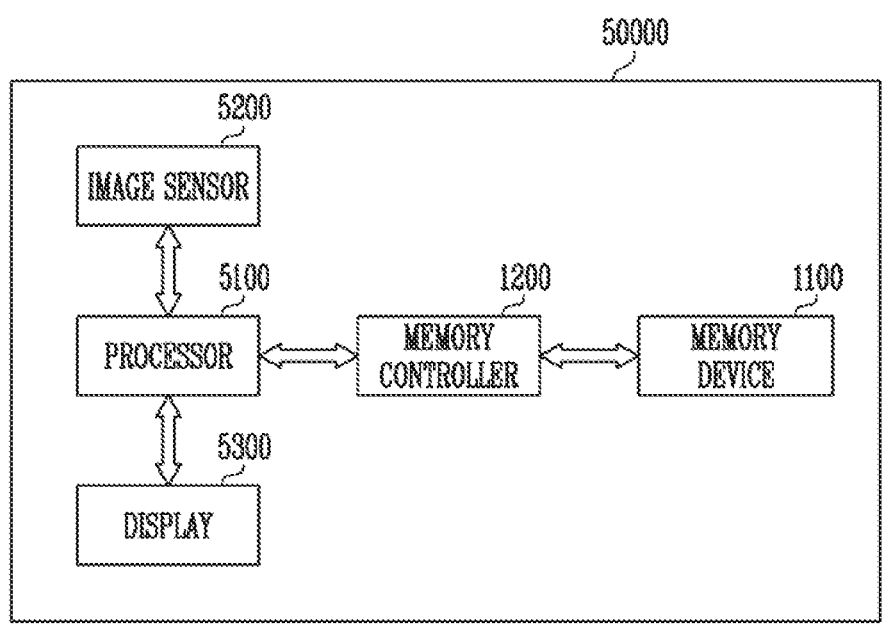
FIG. 19 is a diagram illustrating a memory system in accordance with an embodiment of the present disclosure.

FIG. 19 is a diagram illustrating a memory system 50000 in accordance with an embodiment of the present disclosure.

Referring to FIG. 19, the memory system 50000 may be embodied in an image processing device, e.g., a digital camera, a portable phone provided with a digital camera, a smartphone provided with a digital camera, or a tablet PC provided with a digital camera.

The memory system 50000 may include the memory device 1100, and a controller 1200 capable of controlling a data processing operation, e.g., a program operation, an erase operation, or a read operation, of the memory device 1100.

An image sensor 5200 of the memory system 50000 may convert an optical image into digital signals. The converted digital signals may be transmitted to a processor 5100 or the controller 1200. Under control of the processor 5100, the converted digital signals may be outputted through a display 5300 or stored in the memory device 1100 through the controller 1200. Data stored in the memory device 1100 may be output through the display 5300 under control of the processor 5100 or the controller 1200.

In an embodiment, the controller 1200 capable of controlling the operation of the memory device 1100 may be embodied as a part of the processor 5100 or a chip provided separately from the processor 5100. The controller 1200 may be embodied by an example of the controller 1200 shown in FIG. 1.

Figure 20:
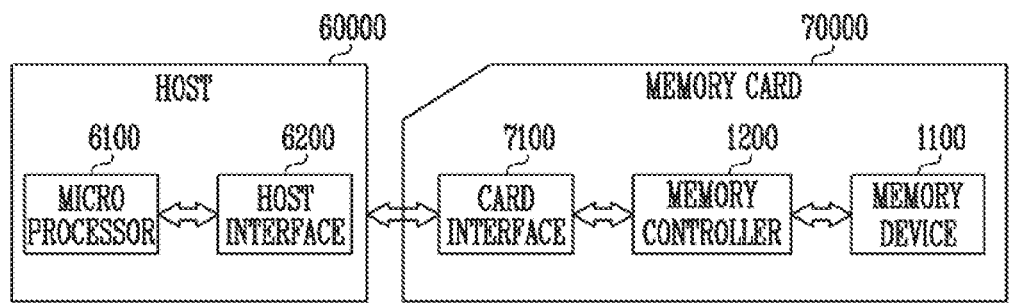
FIG. 20 is a diagram illustrating a memory system in accordance with an embodiment of the present disclosure.

FIG. 20 is a diagram illustrating a memory system 70000 in accordance with an embodiment of the present disclosure.

Referring to FIG. 20, the memory system 70000 may be embodied in a memory card or a smart card. The memory system 70000 may include a memory device 1100, a controller 1200, and a card interface 7100.

The controller 1200 may control data exchange between the memory device 1100 and the card interface 7100. In an embodiment, the card interface 7100 may be a secure digital (SD) card interface or a multi-media card (MMC) interface, but it is not limited thereto. The controller 1200 may be embodied by an example of the controller 1200 shown in FIG. 1.

The card interface 7100 may interface data exchange between the host 60000 and the controller 1200 according to a protocol of the host 60000. In an embodiment, the card interface 7100 may support a universal serial bus (USB) protocol, and an interchip (IC)-USB protocol. Here, the card interface may refer to hardware capable of supporting a protocol which is used by the host 60000, software installed in the hardware, or a signal transmission scheme.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the controller 1200 under control of a microprocessor 6100.

Although the embodiments of the present disclosure have been disclosed, those skilled in the art will appreciate that various modifications, additions and substitutions are possible, without departing from the scope and spirit of the present disclosure.

In various embodiments of the present disclosure, during a program operation, pass voltages to be applied to word lines adjacent to a selected word line may be controlled, whereby the retention characteristics of memory cells may be improved. Consequently, the reliability of data stored in the memory cells may be enhanced.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
a memory cell array including a plurality of word lines;
a peripheral circuit coupled to the memory cell array through the plurality of word lines and configured to apply a program voltage to a selected word line of the plurality of word lines during a program operation and apply a pass voltage to unselected word lines of the plurality of word lines; and
control logic configured to control the peripheral circuit to apply a first pass voltage to word lines adjacent to the selected word line among the unselected word lines during a first program operation of the program operation and apply a second pass voltage to the word lines adjacent to the selected word line during a second program operation of the program operation,
wherein, during the program operation, the first program operation is performed on at least one first page corresponding to a word line which is currently selected and after the first program operation on the at least one first page is completed, the second program operation is performed on at least one second page corresponding to a word line which is previously selected.

2. The semiconductor memory device according to claim 1, wherein the first pass voltage is greater than the second pass voltage.

3. The semiconductor memory device according to claim 1, wherein the control logic sets a program voltage application time of the first program operation and a program voltage application time of the second program operation such that the program voltage application time of the first program operation is longer than the program voltage application time of the second program operation.

4. The semiconductor memory device according to claim 1, wherein the first program operation is a foggy program operation, and the foggy program operation is an operation of programming threshold voltages of memory cells included in the memory cell array to values equal to or greater than a pre-threshold voltage less than a target threshold voltage.

5. The semiconductor memory device according to claim 4, wherein the second program operation is a fine program operation, and the fine program operation is an operation of programming the threshold voltages of the memory cells to values equal to or greater than the target threshold voltage.

6. A semiconductor memory device comprising:
a memory cell array including a plurality of word lines;
a peripheral circuit coupled to the memory cell array through the plurality of word lines and configured to apply a program voltage to a selected word line of the plurality of word lines during a program operation and apply a pass voltage to unselected word lines of the plurality of word lines; and
control logic configured to control the peripheral circuit to perform a program voltage application operation of applying the program voltage and the pass voltage to the plurality of word lines for a first time during a first program operation of the program operation and perform the program voltage application operation for a second time during a second program operation of the program operation,
wherein, during the program operation, the first program operation is performed on at least one first page corresponding to a word line which is currently selected and after the first program operation on the at least one first page is completed, the second program operation is performed on at least one second page corresponding to a word line which is previously selected.

7. The semiconductor memory device according to claim 6, wherein the first time is greater than the second time.

8. The semiconductor memory device according to claim 6, wherein the control logic controls the peripheral circuit to apply a first pass voltage to word lines adjacent to the selected word line among the unselected word lines during the program voltage application of the first program operation, and apply a second pass voltage to remaining unselected word lines among the unselected word lines.

9. The semiconductor memory device according to claim 8,
wherein the control logic controls the peripheral circuit to apply a third pass voltage to the word lines adjacent to the selected word line during the program voltage application operation of the second program operation, and apply the second pass voltage to the remaining unselected word lines, and
wherein the first pass voltage is greater than the third pass voltage.

10. The semiconductor memory device according to claim 6, wherein the first program operation is a foggy program operation, and the foggy program operation is an operation of programming threshold voltages of memory cells included in the memory cell array to values equal to or greater than a pre-threshold voltage less than a target threshold voltage.

11. The semiconductor memory device according to claim 10, wherein the second program operation is a fine program operation, and the fine program operation is an operation of programming the threshold voltages of the memory cells to values equal to or greater than the target threshold voltage.

12. A method of operating a semiconductor memory device, comprising:
performing a first program operation by applying a program voltage to a first selected word line and applying a first pass voltage to word lines adjacent to the first selected word line;
performing the first program operation by applying the program voltage to a second selected word line and applying the first pass voltage to word lines adjacent to the second selected word line; and
performing a second program operation by applying the program voltage to the first selected word line and applying a second pass voltage less than the first pass voltage to the word lines adjacent to the first selected word line.

13. The method according to claim 12, wherein the first program operation is a foggy program operation, and the second program operation is a fine program operation.

14. The method according to claim 12,
wherein the first program operation includes first to m-th program loops (m is a positive integer) among a plurality of program loops included in a program operation using an incremental step pulse program (ISPP) scheme, and
wherein the second program operation includes m+1-th to last program loops among the plurality of program loops.

15. The method according to claim 12, wherein a program voltage application period of the first program operation is greater than a program voltage application period of the second program operation.

* * * * *